United States Patent [19]

Kagawa et al.

[11] Patent Number: 5,164,951
[45] Date of Patent: Nov. 17, 1992

[54] SEMICONDUCTOR LASER DEVICE

[75] Inventors: Hitoshi Kagawa; Tetsuya Yagi, both of Itami, Japan

[73] Assignee: Mitsubishi Denki Kabushiki Kaisha, Tokyo, Japan

[21] Appl. No.: 718,974

[22] Filed: Jun. 21, 1991

[30] Foreign Application Priority Data

Nov. 26, 1990 [JP] Japan .................. 2-324254

[51] Int. Cl.$^5$ ............................................ H01S 3/19
[52] U.S. Cl. ............................................ 372/46; 372/45
[58] Field of Search ............................ 372/45, 46

[56] References Cited

U.S. PATENT DOCUMENTS 4,852,110  7/1989  Fujii et al. ................. 372/45
5,003,549  3/1991  Mitsui et al. ................ 372/46

OTHER PUBLICATIONS

Yonezu et al., "A Ga-Al$_x$Ga$_{1-x}$ As Double Heterostructure Planar Stripe Laser", Japanese Journal of Applied Physics, vol. 12, No. 10, Oct. 1973, pp. 1585-1592.

Primary Examiner—Georgia Y. Epps
Attorney, Agent, or Firm—Leydig, Voit & Mayer

[57] ABSTRACT

A semiconductor laser device includes a first cladding layer, an active layer, and a second cladding layer with a central ridge on a substrate. A current blocking layer is disposed on the second cladding layer burying the ridge. A contact layer is disposed on the current blocking layer and the ridge. The portion of the second cladding layer adjacent to the active layer has a greater resistivity than a portion of the second cladding layer remote from the active layer, reducing leakage current.

12 Claims, 2 Drawing Sheets

SEMICONDUCTOR LASER DEVICE

This invention relates to a semiconductor laser device which may be used in an optical disc memory system, a compact disc system, an optical communications system, etc., and more particularly to such a semiconductor device with a reduced current component that does not contribute to light emission.

BACKGROUND OF THE INVENTION

FIG. 1 shows a cross-section of a conventional buried-ridge AlGaAs semiconductor laser device. The device includes an N-side electrode 1 disposed on one surface of an N-type GaAs substrate 2. An N-type $Al_x Ga_{1-x}As$ first cladding layer 3 is disposed on the opposite surface of the GaAs substrate 2. A P-type or undoped intrinsic $Al_y Ga_{1-y}As$ active layer 4 is disposed on the first cladding layer 3. A P-type $Al_x Ga_{1-x}As$ second cladding layer 5 with a centrally located ridge 51 is disposed on the active layer 4. The second cladding layer 5 is formed by first forming a P-type $Al_x Ga_{1-x}As$ layer having a given thickness on the active layer 4 and removing portions of the thus formed P-type $Al_x Ga_{1-x}As$ layer by photolithographic and etching techniques to thereby leave in a center portion of the layer the ridge 51 which extends in the direction along a laser resonator. An N-type GaAs current blocking layer 7 is formed on the removed portions to bury the ridge 51 in the current blocking layer 7. Over the ridge 51 of the second cladding layer 5 and the current blocking layer 7, a P-type GaAs contact layer 8 is disposed, and a P-side electrode 9 for current injection is disposed on the P-type GaAs contact layer 8.

In FIG. 2, a current flow model for the conventional buried-ridge semiconductor laser device of FIG. 1 is shown. This current flow model has been prepared based on an article, "A GaAs-$Al_x Ga_{1-x}As$ Double Heterostructure Planar Stripe Laser" by Yonezu et al in Japanese Journal of Applied Physics (JJAP), Vol. 12, No. 10, October, 1973, pages 1585-1592.

In FIG. 2, $I_t$ represents a total injected current flowing through a path limited by the width W of the bottom of the ridge 51, $I_e$ represents a current which flows uniformly across the portion of the active layer 4 immediately beneath the ridge 51, and $I_o$ represents a leakage current which flows laterally (i.e. in directions parallel to the plane of the active layer 4) through portions other than those portions within the width W of the bottom of the ridge 51. Let it be assumed that the second cladding layer 5 has a thickness $d_{CL}$ and a resistivity $\rho$, that the thickness $d_{CL}$ is small relative to the width W, and further that the thickness of the active layer 4 is negligibly small.

The total current $I_t$ flowing through the ridge 51 is expressed by the following equation (1).

$$I_t = I_e + 2 I_o \quad (1)$$

Assuming that the lateral direction is the y-axis, current $-dI_y$ flowing through the junction between locations y and $y + \Delta y$ is expressed by the following equation (2).

$$-d I_y = L_c J_s (\exp(\beta V_y) - 1) dy \quad (2)$$

where:
$L_c$ is the resonator length,
$J_s$ is the saturation current density,
$V_y$ is the junction voltage at a position y in FIG. 2, and
$\beta$ is equal to q/nKT, in which q is the elementary charge, k is the Boltzman constant, T is temperature, and n is assumed to be a generation/recombination current ratio that is usually equal to 2.

The voltage drop $-dV_y$ in the second cladding layer 5 is expressed by the following equation (3).

$$-d V_y = \rho_y I_y dy \quad (3)$$

wherein
$I_y$ is current flowing at the location y in the y-axis direction, and
$\rho_y$ is a value expressed as $\rho_y = \rho/(L_C \times d_{CL})$, in which, as stated previously, $\rho$ is the resistivity of the second cladding layer 5 and $L_C$ is the resonator length.

Assuming that $\exp(\beta V_y) >> 1$ (the assumption being always true in this technical field), the following equation (4) can be derived from the equations (2) and (3).

$$\frac{d^2 I_y}{d y^2} = -\beta \cdot \rho_y \cdot I_y \cdot \frac{dI_y}{dy} \quad (4)$$

The solution of the equation (4) is $$I_y = \frac{I_o}{1 + \frac{y}{l_o}} \quad (5)$$

where $l_o = 2/(\beta \cdot \rho_y \cdot I_o)$.

The current flowing through the junction between y and $y + \Delta y$, expressed as a function of y, $\Delta I_j(y)$, can be expressed, using the equation (5), by the following equation (6).

$$\Delta I_j(y) = \frac{I_o}{l_o \left(1 + \frac{y}{l_o}\right)^2} \cdot \Delta y \quad (6)$$

Since current $I_j(0)$ at the bottom of the ridge having a width W is $I_e$, $$\Delta I_j(0) = \frac{\beta \cdot \rho_y \cdot I_o^2}{2} \cdot W \quad (7)$$

Substituting the equation (7) into the equation (1), the following equation (8) results.

$$\frac{W \cdot \beta \cdot \rho_y}{2} I_o^2 + 2I_o - I_t = 0 \quad (8)$$

Solving the equation (8) with respect to $I_o$, the following equation (9) is derived.

$$I_o = \frac{2}{W \cdot \beta \cdot \rho_y} \times \left\{ -1 + \left(1 + \frac{W \cdot \beta \cdot \rho_y}{2} \cdot I_t\right)^{\frac{1}{2}} \right\} \quad (9)$$

As described above, $I_o$ represents a leakage current flowing in the y-axis direction which is in parallel with the plane of the active layer 4. The magnitude of the leakage current $I_o$ is largely dependent on $\rho_y$ and, hence, on the resistivity $\rho$ and the thickness $d_{CL}$ of the second cladding layer 5, as is understood from the equation (9).

Let it be assumed that the thickness of the second cladding layer 5, $d_{CL}=0.25$ μm and the resistivity $\rho=0.05$ Ω·cm. When the resonator length $L_C=250$ μm, the actual total injected current $I_t$ will contain a leakage current of about 40%. When the resistivity $\rho$ of the second cladding layer 5 is 0.08 Ω·cm, with the other conditions maintained the same as the above, the percentage of the leakage current $I_o$ in the total injected current $I_t$ will be reduced to about 35%.

As will be understood from the above explanation, in the conventional semiconductor laser device shown in FIG. 1, the leakage current $I_o$ is largely dependent on the thickness and resistivity of the second cladding layer 5. In order to reduce the leakage current $I_o$, a higher resistivity $\rho$ could be employed for the second cladding layer 5. However, when a high resistivity $\rho$ second cladding layer is used, the resistance of the device increases and, accordingly, heat generated by the device also increases, which is not desirable for a semiconductor laser device.

The object of the present invention is to eliminate the above-mentioned problem seen in conventional semiconductor devices as described above, by providing a semiconductor laser device having its resistance minimized as much as possible and having a reduced leakage current component $I_o$.

SUMMARY OF THE INVENTION

According to the present invention, a semiconductor laser device includes a second cladding layer which is disposed on the active layer and has a higher resistivity in a portion nearer the active layer than remote from the active layer, i.e., in the portion nearer to the current blocking layer.

Due to a higher resistivity in a portion of the second cladding layer nearer to the active layer than in a portion remote from the active layer, the leakage current component flowing in the direction orthogonal to the direction of growth of the second cladding layer is reduced. Also, due to a lower resistivity in the portion of the second cladding layer remote from the active layer, the overall resistance of the device does not increase much and, therefore, the amount of heat generated by the device does not increase.

DETAILED DESCRIPTION OF PREFERRED EMBODIMENT

Figure 1:
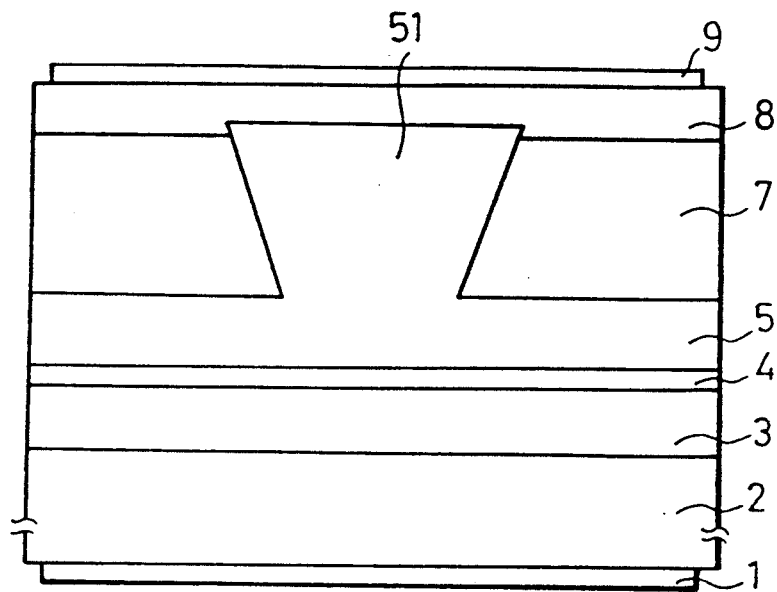
FIG. 1 is a cross-sectional view of one example of a conventional semiconductor laser device.
Figure 2:
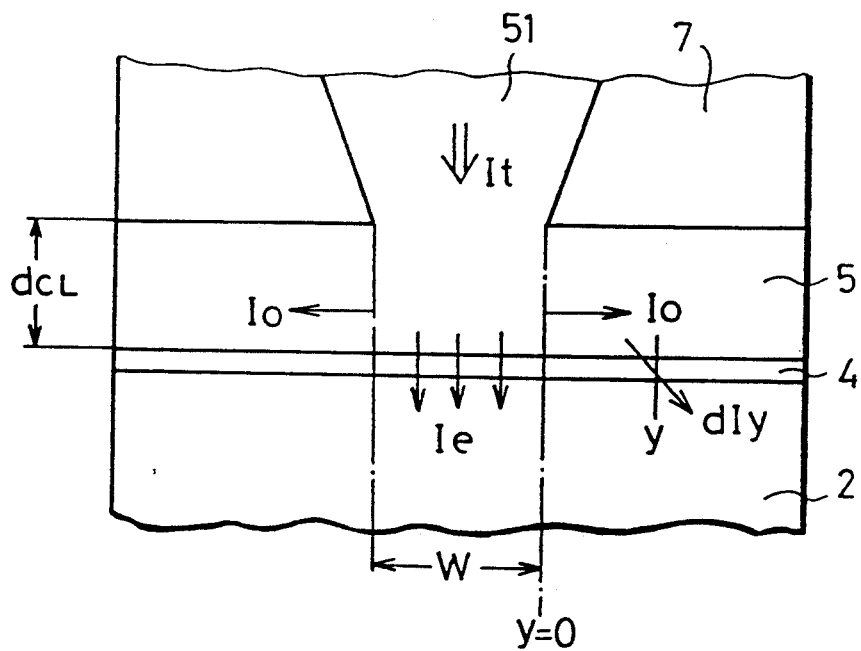
FIG. 2 is a cross-sectional view of the conventional semiconductor laser device of FIG. 1, for use in analyzing the magnitude of leakage current $I_o$ with respect to the total injected current $I_t$ of the device.

Now, the present invention is described in detail with reference to FIG. 3 which shows a so-called internal stripe semiconductor laser device according to one embodiment of the present invention. In the following discussion, reference numerals and symbols that are the same as those which are used in FIGS. 1 and 2 denote similar elements. Similar to the conventional semiconductor laser device shown in FIG. 1, an N-side electrode 1 is disposed on one surface of an N-type GaAs substrate 2, for example. On the opposite surface of the substrate 2, an N-type $Al_xGa_{1-x}As$ first cladding layer 3 is disposed. A P-type $Al_yGa_{1-y}As$ active layer 4 is disposed on the first cladding layer 3. On the active layer 4, a P-type $Al_xGa_{1-x}As$ second cladding layer 5 with a centrally located ridge 51 extending in the direction in which a laser resonator extends is disposed. As in the conventional device shown in FIG. 1, the ridge 51 of the second cladding layer 5 is formed by first forming a P-type $Al_xGa_{1-x}As$ layer of a predetermined thickness on the active layer 4 and then removing portions of the layer by means of photolithographic and etching techniques so that the remaining portion, which becomes the ridge 51, extends centrally along the direction of the laser resonator. An N-type GaAs current blocking layer 7 buries the ridge 51. A P-type GaAs contact layer 8 is disposed overlying the ridge 51 of the second cladding layer 5 and the current blocking layer 7. A current injecting P-side electrode 9 is disposed on the contact layer 8.

The second cladding layer 5 comprises first and second stacked sub-layers 61 and 62. The first sub-layer 61 is located closer to the active layer 4 than the sub-layer 62 and has a resistivity $\rho$ which is greater than the resistivity $\rho_2$ of the second sub-layer 62. Sub-layer 62 is located remote from the active layer 4. That is, the first sub-layer 61 has a resistivity $\rho_1$ of about 0.08 Ω·cm, whereas the second sub-layer 62 has a resistivity $\rho_2$ of about 0.05 Ω·cm. The first sub-layer 61 has a thickness $d_1$.

Figure 3:
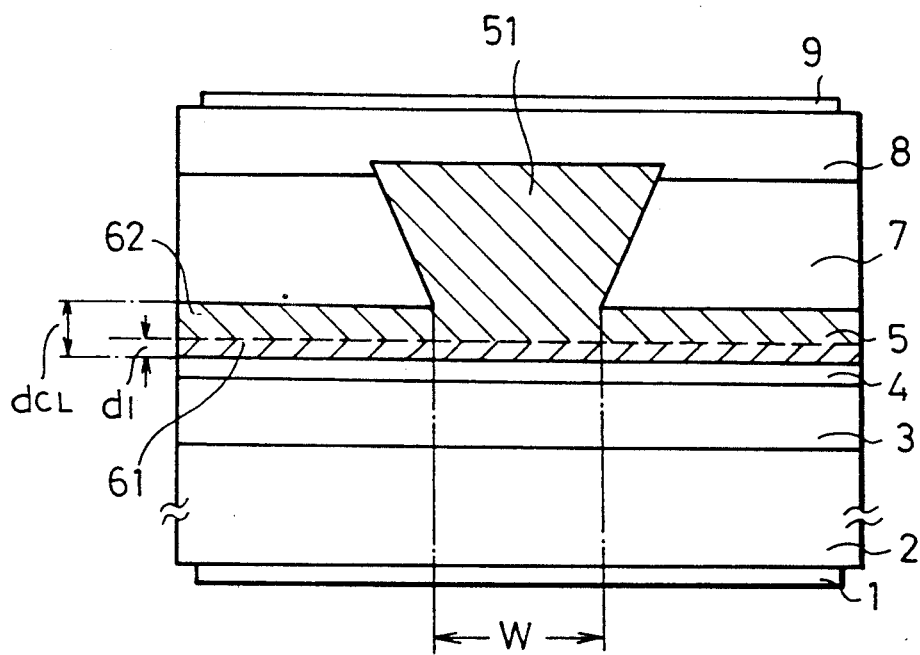
FIG. 3 is a cross-sectional view of a semiconductor device according to one embodiment of the present invention.

The leakage current component $I_o$ in the semiconductor laser device according to the embodiment of the invention shown in FIG. 3 is expressed by the equation (b 9).

$$I_o = \frac{2}{W \cdot \beta \cdot \rho_y} \times \left\{ -1 + \left( 1 + \frac{W \cdot \beta \cdot \rho_y}{2} \cdot I_t \right)^{\frac{1}{2}} \right\} \quad (9)$$

where $\rho_y=\rho/(L_C \times d_{CL})$. According to the present invention, the leakage current component $I_o$ of the total injected current $I_t$ which flows through the path defined by the width W of the bottom of the ridge 51 is dependent on $\rho$ and $d_{CL}$, which determine $\rho_y$ of the second cladding layer 5, and particularly on the resistivity $\rho_1$ and thickness $d_1$ of the first sub-layer 61 of the second cladding layer 5. As stated above, according to the present invention, the resistivity $\rho_1$ of the first sub-layer 61 closer to the active layer 4 is about 0.08 Ω·cm which is greater than the resistivity $\rho_2$ of the remaining second sub-layer 62 which is about 0.05 Ω·cm. Thus, the leakage current component $I_o$ is reduced accordingly. The thickness $d_1$ of the first sub-layer 61 of the second cladding layer 5 is selected in accordance with the desired amount of reduction of the leakage current component $I_o$. When the thickness $d_{CL}$ of the second cladding layer 5 is about 0.25 μm as in the conventional device shown in FIG. 1 or 2, the thickness $d_1$ of the first sub-layer 61 is preferably from 0.05 μm to 0.2 μm. When the resistivity $\rho_2$ of the second sub-layer 62 is 0.05 Ω·cm, the resistivity $\rho_1$ of the first sub-layer 61 is preferably a value within a range of from 0.07 Ω·cm to 0.10 Ω·cm, that is, within a range of from 1.4 to 2 times the resistivity of the second sub-layer 62.

It has been found that in the illustrated embodiment of the present invention, when the thickness $d_{CL}$ of the second cladding layer 5 is 0.25 μm, the thickness $d_1$ of the first sub-layer 61 of the layer 5 is from 0.05 μm to 0.2

μm, the resistivity $\rho_1$ of the first sub-layer 61 is 0.08 Ω·cm, and the resistivity $\rho_2$ of the second sub-layer 62 of the layer 5 is 0.05 Ω·cm, the leakage current component of the total injected current $I_t$ is about 35%. That is more than a 5% improvement relative to the percentage of the leakage current of more than 40% of the conventional semiconductor laser device when the second cladding layer 5 has a uniform resistivity $\rho = 0.05$ Ω·cm throughout the thickness thereof. Furthermore, because the resistivity of the second cladding layer 5 as a whole does not increase much, the increase of generated heat is not significant.

The device shown and described in the above is only an example, and various modifications are possible. For example, the second cladding layer 5 may comprise more than two sub-layers stacked on one another with the respective sub-layers having resistivities successively decreasing from a value of the sub-layer closest to the active layer 4 toward a value of a sub-layer remote from the active layer 4. Alternatively, the second cladding layer 5 may be formed with a resistivity continuously decreasing from the portion closest to the active layer 4.

The conductivity types of the substrate and the respective layers may be reversed from those shown and described above. That is, a P-side electrode 1 may be disposed on one surface of a P-type substrate 2 with a P-type first cladding layer 3, a P-type active layer 4, an N-type second cladding layer 5, a P-type current blocking layer 7, an N-type contact layer 8, and an N-side electrode 9 successively disposed on the opposite surface from the substrate 2. Further, an undoped or intrinsic active layer 4 may be used.

The materials of the substrate and the respective layers may be GaAs-AlGaAs or any other suitable materials.

As described above, according to the present invention, a second cladding layer of a semiconductor laser device has a portion adjacent to the active layer which has a higher resistivity than the remaining portion of the second cladding layer, so that a leakage current component which flows in a direction perpendicular to the thickness of respective layers of the device is reduced. Because the remaining portion of the second cladding layer has a low resistivity, of the same order as that of a second cladding layer of a conventional increase of the resistivity of the device as a whole can be minimized, so that the heat generated by flowing current does not increase. Thus, the present invention provides a semiconductor laser device which has a high efficiency at a low current threshold and also has a long life.

What is claimed is:

1. A semiconductor laser device comprising:
a first conductivity type substrate;
a first conductivity type first cladding layer disposed on said substrate;
an active layer disposed on said first cladding layer;
a second conductivity type second cladding layer disposed on said active layer, said second cladding layer including a central ridge having side walls and substantially planar portions thinner than said central ridge disposed at opposite sides of said central ridge;
a first conductivity type current blocking layer disposed on said substantially planar portions of said second cladding layer and contacting the side walls of said central ridge;
a second conductivity type contact layer disposed on said central ridge of said second cladding layer and on said current blocking layer beside said central ridge wherein the resistivity of a part of said substantially planar portions of said second cladding layer nearer to said active layer than said current blocking layer is larger than the resistivity of a part of said substantially planar portions of said second cladding layer nearer to said current blocking layer than said active layer; and
first and second electrodes disposed on said substrate and said contact layer, respectively.

2. A semiconductor laser device comprising:
a first conductivity type GaAs substrate;
a first conductivity type $Al_xGa_{1-x}As$ first cladding layer disposed on said substrate;
an $Al_yGa_{1-y}As$ active layer disposed on said first cladding layer;
a second conductivity type $Al_xGa_{1-x}As$ second cladding layer disposed on said active layer, said second cladding layer including a central ridge having side walls and substantially planar portions thinner than said central ridge disposed on opposite sides of said central ridge;
a first conductivity type GaAs current blocking layer disposed on said substantially planar portions of said second cladding layer and contacting the side walls of said central ridge;
a second conductivity type GaAs contact layer disposed on said ridge of said second cladding layer and on said current blocking layer beside said central ridge wherein the resistivity of a part of said substantially planar portions of said second cladding layer nearer to said active layer than said current blocking layer is larger than the resistivity of a part of said substantially planar portions of said second cladding layer nearer to said current blocking layer than said active layer; and
first and second electrodes disposed on said substrate and said contact layer, respectively.

3. A semiconductor laser device according to claim 1 wherein said second cladding layer comprises first and second stacked layer portions, said first layer portion being adjacent to said active layer and said second layer portion remote from said active layer, and the resistivity of said first layer portion being larger than the resistivity of said second layer portion.

4. A semiconductor laser device according to claim 2 wherein said second cladding layer comprises first and second stacked layer portions, said first layer portion adjacent to said active layer and said second layer portion remote from said active layer, and the resistivity of said first layer portion being larger than the resistivity of said second layer portion.

5. A semiconductor laser device according to claim 1 wherein said second layer comprises at least three stacked layer portions, the resistivities of said layer portions decreasing stepwise from the maximum resistivity of a layer portion adjacent to said active layer.

6. A semiconductor laser device according to claim 2 wherein said second layer comprises at least three stacked layer portions, the resistivities of said layer portions decreasing stepwise from the layer portion adjacent to said active layer toward a layer remote from said active layer.

7. A semiconductor laser device according to claim 1 wherein said second cladding layer has a resistivity continuously decreasing from a portion adjacent to said active layer toward a portion remote from said active layer.

8. A semiconductor laser device according to claim 2 wherein said second cladding layer has a resistivity continuously decreasing from a portion adjacent to said active layer toward a portion remote from said active layer.

9. A semiconductor laser device according to claim 1 wherein said first conductivity-type is N-type, and said second conductivity-type is P-type.

10. A semiconductor laser device according to claim 2 wherein said first conductivity-type is N-type, and said second conductivity-type is P-type.

11. A semiconductor laser device according to claim 1 wherein said first conductivity-type is P-type, and said second conductivity-type is N-type.

12. A semiconductor laser device according to claim 2 wherein said first conductivity-type is P-type, and said second conductivity-type is N-type.

* * * * *